US012154613B2

(12) United States Patent
Brox et al.

(10) Patent No.: US 12,154,613 B2
(45) Date of Patent: Nov. 26, 2024

(54) POWER-EFFICIENT ACCESS LINE OPERATION FOR MEMORY

(71) Applicant: Micron Technology, Inc., Boise, ID (US)

(72) Inventors: Martin Brox, Munich (DE); Manfred Hans Plan, Munich (DE)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 17/662,741

(22) Filed: May 10, 2022

(65) Prior Publication Data

US 2023/0368833 A1 Nov. 16, 2023

(51) Int. Cl.
*G11C 11/408* (2006.01)
*G11C 11/406* (2006.01)
*G11C 11/4074* (2006.01)
*G11C 11/4096* (2006.01)

(52) U.S. Cl.
CPC .... *G11C 11/4085* (2013.01); *G11C 11/40615* (2013.01); *G11C 11/4074* (2013.01); *G11C 11/4096* (2013.01)

(58) Field of Classification Search
CPC .......... G11C 11/4085; G11C 11/40615; G11C 11/4074; G11C 11/4096; G11C 8/08; G11C 8/18

USPC ...................................................... 365/185.13
See application file for complete search history.

(56) References Cited

U.S. PATENT DOCUMENTS

| 12,002,542 | B2 * | 6/2024 | Yang | G11C 5/06 |
| 2006/0083100 | A1 * | 4/2006 | Schroeder | G11C 29/025 |
| | | | | 365/230.06 |
| 2021/0057009 | A1 * | 2/2021 | Kim | G11C 8/08 |
| 2023/0290408 | A1 * | 9/2023 | Kobayashi | G11C 7/12 |
| 2023/0298670 | A1 * | 9/2023 | Park | G11C 8/08 |
| | | | | 365/185.29 |

FOREIGN PATENT DOCUMENTS

TW 1762158 B * 4/2022

* cited by examiner

*Primary Examiner* — Fernando Hidalgo
(74) *Attorney, Agent, or Firm* — Holland & Hart LLP

(57) ABSTRACT

Methods, systems, and devices for power-efficient access line operation for memory are described. A memory device may drive a voltage pulse on a first word line included in a set of word lines that is coupled with a master word line. The memory device may then a voltage pulse on a second word line included in the set of word lines coupled with the master word line. In between driving the voltage pulse on the first word line and driving the voltage pulse on the second word line, the memory device may maintain a voltage on the master word line below a threshold level.

30 Claims, 9 Drawing Sheets

POWER-EFFICIENT ACCESS LINE OPERATION FOR MEMORY

FIELD OF TECHNOLOGY

The following relates to one or more systems for memory, including power-efficient access line operation for memory.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

A memory device may include memory cells that are accessed by activating (e.g., energizing, applying a threshold voltage to) word lines that are coupled with the memory cells. A set of word lines may be coupled with a master word line that the memory device uses, along with a respective selection circuit for each word line, to select an individual word line to activate for an access operation. For example, to activate an individual word line, the voltage on the master word line coupled with the individual word line may be decreased and the selection circuit for the individual word line may be controlled so that the individual word line is coupled with a voltage supply.

Before activating another individual word line, the memory device may increase the voltage on the master word line (e.g., so that the master word line is in a standby state). So, the memory device may pulse (e.g., decrease then increase) the voltage on the master word line in between activating different individual word lines. But each increase of the voltage on the master word line may draw current, so indiscriminately pulsing the master word line voltage in between activating different individual word lines may consume a non-trivial amount of power, among other disadvantages.

According to the techniques described herein, a memory device may reduce the power consumption associated with operating the master word line by recognizing situations in which pulsing of the voltage on the master word line can be avoided in between activating different individual word lines. For example, the memory device may determine whether consecutive (e.g., back-to-back) activate commands are for individual word lines coupled with a same master word line and, if so, the memory device may maintain the voltage on that same master word line below a threshold level in between activating the individual word lines, which will lead to power savings, among other advantages.

Features of the disclosure are initially described in the context of systems and dies as described with reference to FIGS. 1 and 2. Features of the disclosure are described in the context a memory device, timing diagrams, and a process flow as described with reference to FIGS. 3 through 5. These and other features of the disclosure are further illustrated by and described with reference to an apparatus diagram and flowcharts that relate to power-efficient access line operation for memory as described with reference to FIGS. 6 through 9.

Figure 1:
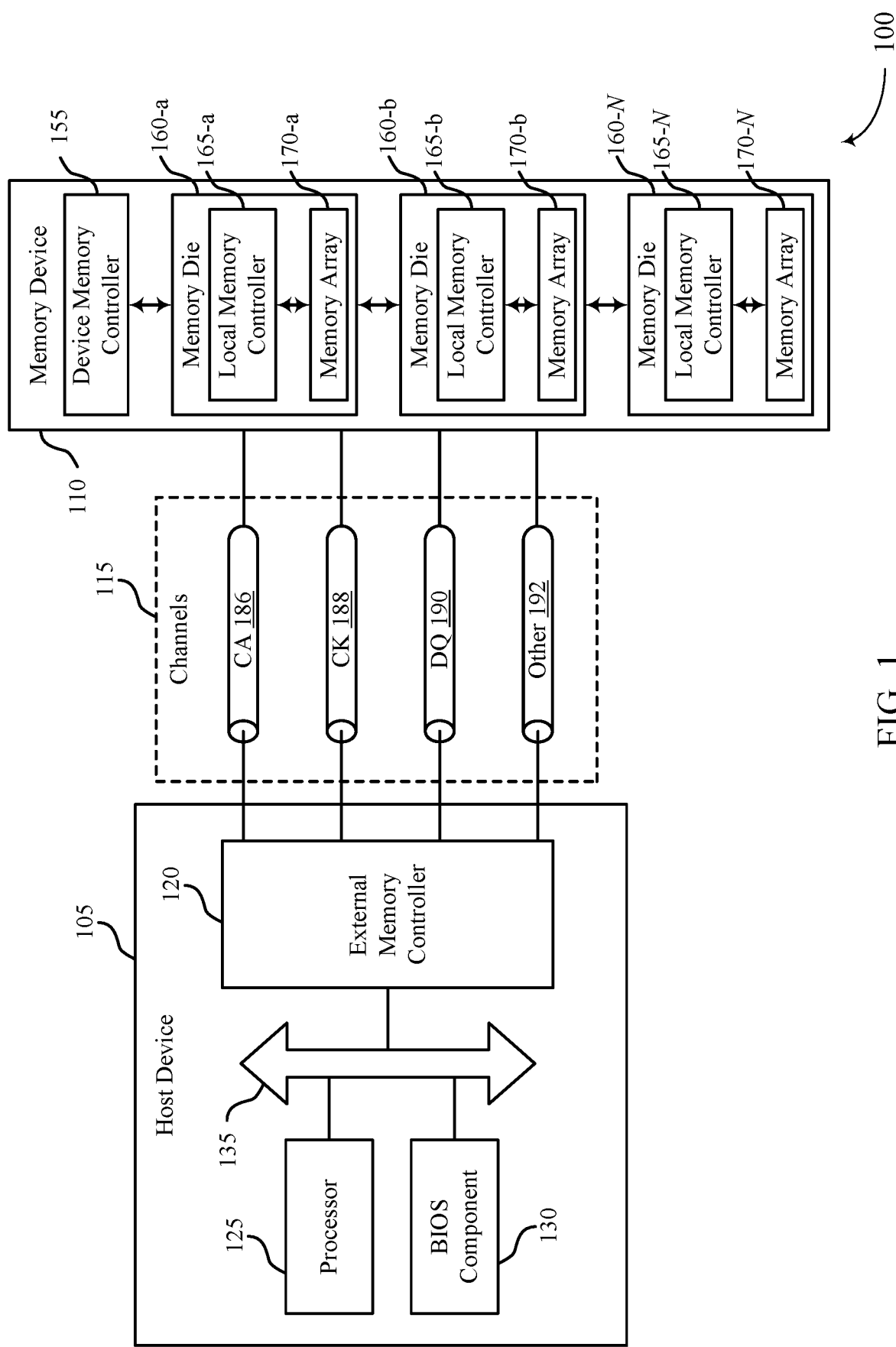
FIG. 1 illustrates an example of a system that supports power-efficient access line operation for memory in accordance with examples as disclosed herein.

FIG. 1 illustrates an example of a system 100 that supports power-efficient access line operation in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals (e.g., associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The memory device 110 may access memory cells in a memory die 160 by activating the word lines coupled with the memory cells. To activate a word line (e.g., an individual word line), the memory device 110 may decrease the voltage on a master word line that is coupled with the word line and may control a circuit (e.g., a selection circuit) specific to that word line to select the word line from the set of word lines coupled with the master word line. Before activating another word line, the memory device 110 may increase the voltage on the master word line (e.g., so that the master word line is in a standby state). But increasing the master word line voltage may draw current from the voltage supply used to energize the master word line, which in turn may increase the power consumption of the memory device 110.

According to the techniques described herein, a memory device 110 may reduce the power consumption associated with operating a master word line by determining that one or more conditions for maintaining the master word line voltage below a threshold level (e.g., a level below which one or more switching components coupled with the master word line are activated or deactivated) are satisfied. For example, rather than pulsing the master word line voltage between consecutive (e.g., back-to-back) activations of different word lines, the memory device may maintain the master word line voltage below a threshold level if the word lines are coupled with the same master word line.

Figure 2:
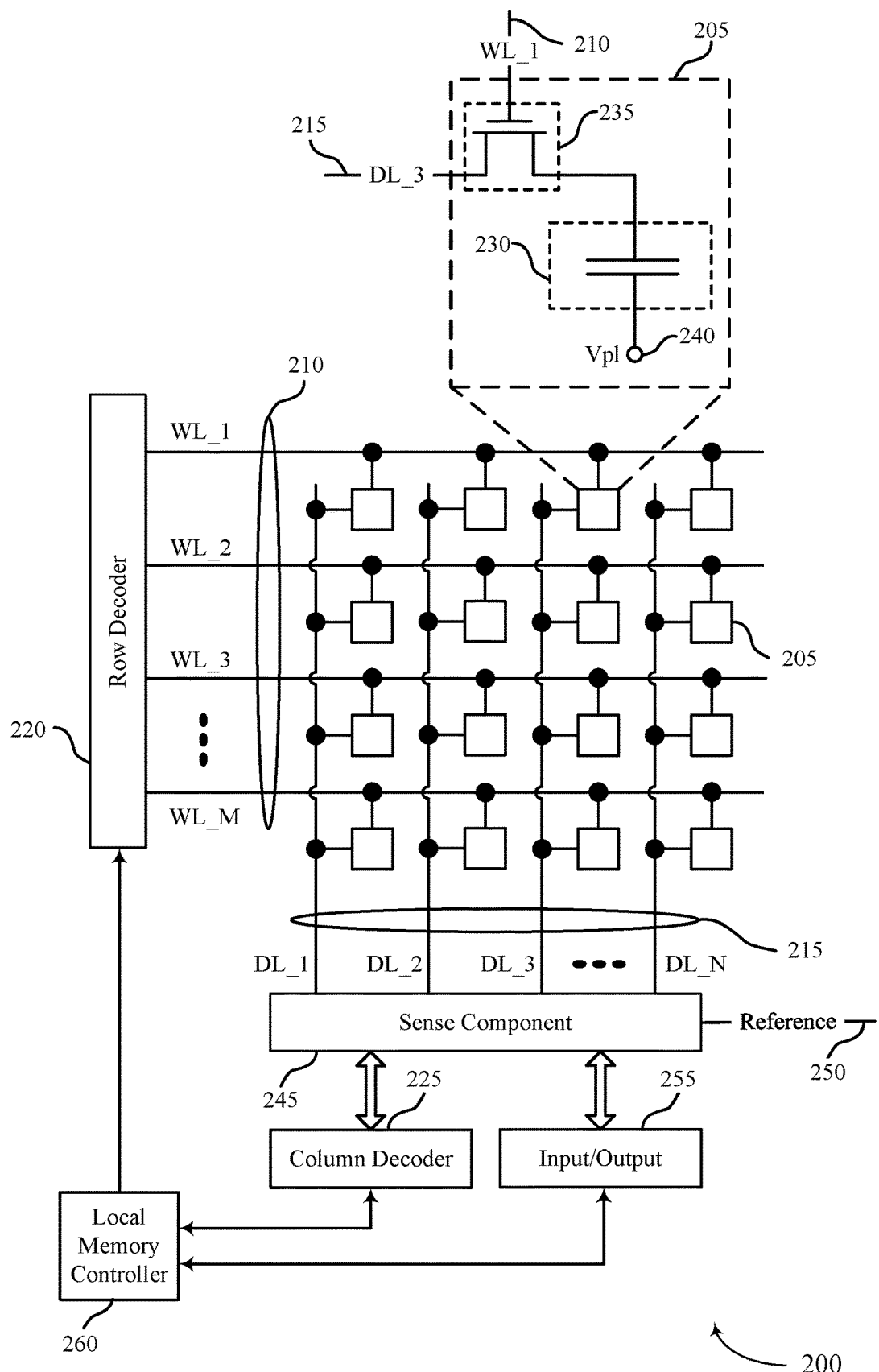
FIG. 2 illustrates an example of a memory die that supports power-efficient access line operation for memory in accordance with examples as disclosed herein.

FIG. 2 illustrates an example of a memory die 200 that supports power-efficient access line operation in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 (e.g., an individual target word line 210) and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

In some examples, the word lines 210 (which may also be referred to as local word lines) coupled with a set of memory cells may be coupled with a master word line. For example, multiple (e.g., eight) word lines 210 may be coupled with a master word line that is shared by the word lines. To access the memory cells coupled with the word lines 210, the memory die 200 may decrease the voltage on the master word line. To conserve power, according to the techniques described herein, the memory die 200 may maintain the voltage on the master word line at or below a threshold voltage in between activating different word lines coupled with the master word line.

Figure 3:
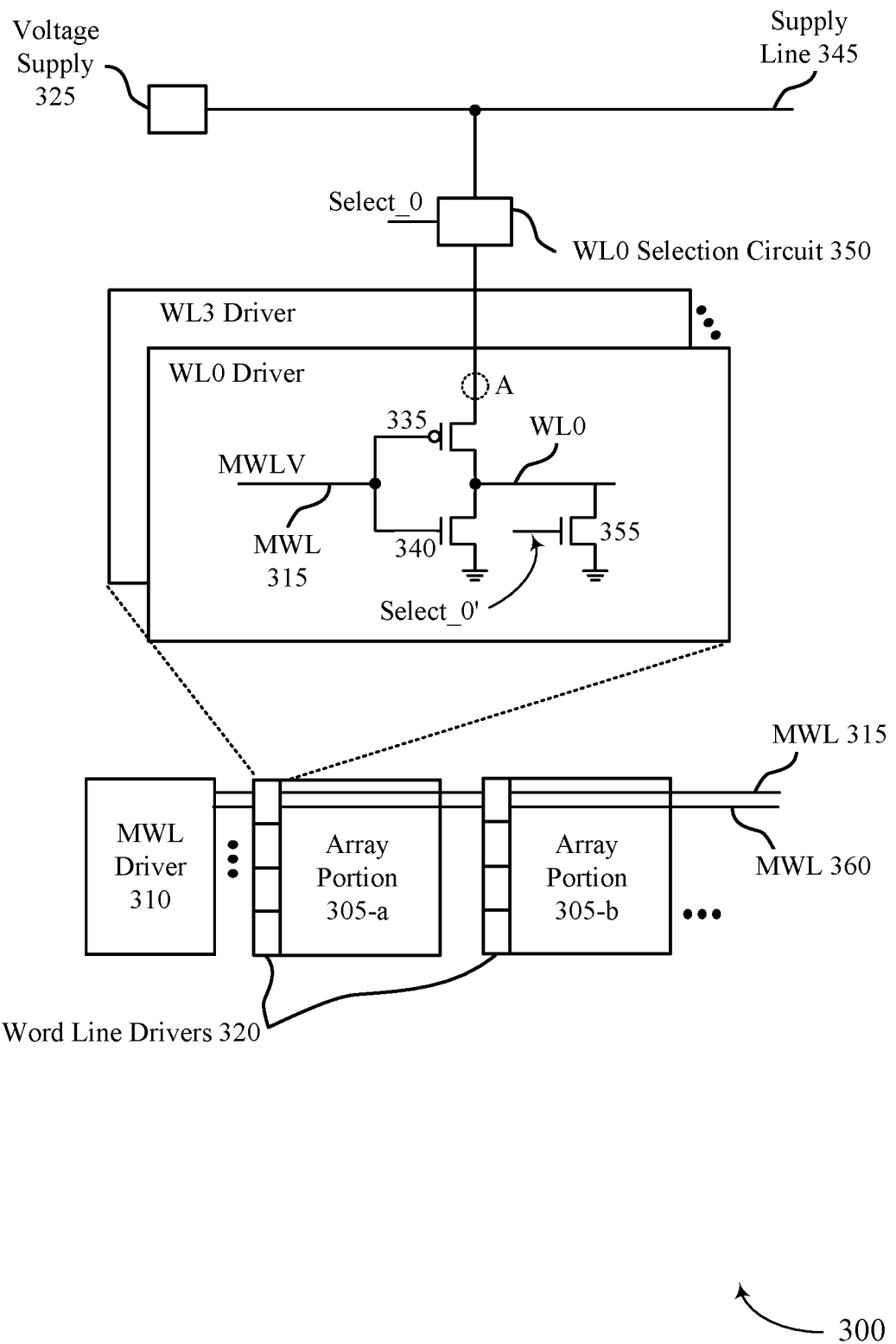
FIG. 3 illustrates an example of a memory device that supports power-efficient access line operation in accordance with examples as disclosed herein.

FIG. 3 illustrates an example of a memory device 300 that supports power-efficient access line operation in accordance with examples as disclosed herein. The memory device 300 may be an example of a memory device 110, a memory die 160, or a memory die 200 as described with reference to FIGS. 1 and 2. The memory device 300 may include a memory array, which may be logically or physically divided into array portion 305-*a* and array portion 305-*b,* among other array portions, and one or more master word lines drivers, such as the master word line (MWL) driver 310. The MWL driver 310 may be configured to maintain the voltage on the master word line 315 at or below a threshold level in between accessing different word lines (e.g., different individual word lines) coupled with the master word line 315, which may improve the power efficiency associated with operating the master word line 315.

An array portion 305 may include memory cells that are coupled with various access lines, sense components, and other circuitry that supports accessing the memory cells. For example, the memory cells in an array portion 305 may be coupled with word lines (e.g., running horizontally) and digit lines (e.g., running vertically). To access (e.g., read, write, refresh) the memory cell coupled with a word line and a digit line, the memory device 300 may activate (e.g., energize) the word line by coupling the word line with supply line 345, which may be coupled with the voltage supply 325. The voltage supply 325 may be configured to provide a supply voltage, such as VCCP, for operating the array portions 305. The memory device 300 may use the MWL driver 310, the word line drivers 320, and the selection circuits 350 to control which word line is activated. For example, to activate word line 0 (denoted WL0), the memory device 300 may use the MWL driver 310 to control the WL0 driver so that word line 0 is coupled with node A, and may use the WL0 selection circuit 350 to couple node A with the supply line 345.

Coupling a first component with a second component may refer to establishment of a conductive path between the components such that current is able to flow between the first component and the second component. Decoupling a first component from a second component may refer to the removal of a conductive path between the components such that current is unable to flow between the first component and the second component.

The word lines in the memory array may be grouped into sets of one or more word lines that are coupled with a respective master word line. For example, word lines 0 through 7 may be coupled with master word line 315, where word lines 0 through 3 are in array portion 305-*a,* in some examples, and word lines 4 through 7 are in array portion 305-*b,* in some examples. In some examples, word lines 0 through 3 may have even addresses and word lines 4-7 may have odd addresses. Each word line may be coupled with a respective word line driver 320, which may be at least partially controlled by or based on the voltage on the master word line coupled with that word line driver. For example, word line drivers for word lines 0 through 7 may be coupled with, and at least partially controlled by or based on, the master word line 315. For simplicity, only the word line drivers for word lines 0 through 3 are shown. The word line drivers for word lines 4 through 7, which may be coupled with the array portion 305-*a* or the array portion 305-*b,* are omitted from the illustration.

A word line driver may be coupled with a respective selection circuit that is configured to couple and decouple the word line driver and the supply line 345. For example, the WL0 driver may be coupled with WL0 selection circuit 350, which may be configured to couple and decouple the WL0 driver and the supply line 345 based on a control signal (e.g., a control voltage) denoted Select_0. A selection circuit may also be referred to as a driver circuit, a controller circuit, or other suitable terminology.

In some examples, a selection circuit, such as the WL0 selection circuit 350, may be include a set (e.g., pair) of switching components that are controlled by Select_0 and that are configured similar to switching component 335 and switching component 340. For instance, Select_0 may be applied to the gates of the switching components to couple and decouple node A (which may be electrically between the switching components) from the supply line 345, a ground reference node, or both. As an example, Select_0 may be applied at a level so that a first switching component couples node A with the supply line 345 and so that a second switching component decouples node A from the ground reference node. At a different level, Select_0 may cause the first switching component to decouple node A from the supply line 345 and may cause the second switching component to couple node A with the ground reference.

A word line driver 320 may include a set (e.g., pair) of switching components in series and a switching component configured as a pull-down component. For example, WL0 driver may include switching component 335 and switching component 340, which may be controlled (e.g., activated and deactivated) by or based on the voltage on the master word line 315 (denoted MWLV), and may also include switching component 355, which may be controlled by or based on the voltage Select_0' (which may be the complement of the Select_0 signal applied to the WL0 selection circuit 350). Activating the switching component 335 may couple word line 0 with node A, which in turn may be coupled with the supply line 345 by activating the WL0 selection circuit 350. Deactivating the switching component 340 and switching component 355 may decouple word line 0 from the ground reference. In the reverse, deactivating the switching component 335 may decouple word line 0 from node A, and activating the switching component 340 and the switching component 355 may couple word line 0 with the ground reference. In some examples, the switching component 355 may be referred to as a pull-down component or a keeper-transistor.

Activating a switching component may refer to placing the switching component in a conductive state in which current is able to flow through the switching component (e.g., from one terminal to another terminal). Deactivating a switching component may refer to placing the switching component in a non-conductive state in which current is unable to flow through the switching component (e.g., from one terminal to another terminal).

The MWL driver 310 may be coupled with various word line drivers 320 and may be configured to at least partially control (e.g., activate, deactivate) the word line drivers 320. For example, the MWL driver 310 may be coupled (via at least the master word line 315) with the word line drivers for the word lines 0 through 7. The MWL driver 310 may be configured to increase and decrease the voltages applied to access lines, such as master word lines (including the master word line 315). The MWL driver 310 may be coupled with one or more sets of word lines via one or more master word lines. As an illustration, if an array portion 305 has 1,024 word lines and each master word line is coupled with eight word lines, the MWL driver 310 may be coupled with the 1,024 word lines via 128 master word lines. Other quantities of word lines, master word lines, and word line drivers are contemplated and within the scope of the disclosure.

To activate a word line (e.g., word line 0, denoted WL0), the memory device 300 may (e.g., via the MWL driver 310) decrease the voltage on the master word line coupled with the word line (e.g., master word line 315). For example, the memory device 300 may decrease the MWL driver 310 below a threshold level to deactivate switching component 340 (thereby decoupling word line 0 from the ground reference) and to activate switching component 335 (thereby coupling word line 0 with node A). The memory device 300 may then increase voltage of the Select_0 signal so that the word line 0 selection circuit 350 is activated and node A is coupled with the supply line 345. Concurrent with increasing the voltage of the Select_0 signal, the memory device 300 may decrease the voltage of the Select_0' signal to deactivate switching component 355 so that word line 0 is decoupled from the ground reference. Thus, the memory device 300 may activate word line 0 by charging word line 0 from the supply line 345.

To prevent the other word lines coupled with the master word line 315 (e.g., word lines 1 through 7) from also charging from the supply line, the memory device 300 may control the selection circuits for those word lines so that the corresponding word line drivers remain decoupled from the supply line 345.

To precharge the word line 0, the memory device 300 may decrease the voltage on word line 0 by deactivating the selection circuit 350 (thereby decoupling node A from the supply line 345) and activating the switching component 355 (thereby coupling word line 0 with the ground reference). The memory device 300 may then increase the voltage on the master word line 315 (e.g., MWLV) above the threshold level to activate switching component 340 (thereby coupling WL0 with the ground reference) and to deactivate switching component 335 (thereby decoupling WL0 from node A).

So, the memory device 300 may pulse (e.g., decrease then increase) the voltage on the master word line 315 to activate and precharge a word line. To reduce current consumption, which may occur in response to increasing the voltage on the master word line 315 (e.g., MWLV), the memory device 300 may delay the rising edge of the pulse until a word line coupled with a master word line other than the master word line 315 (e.g., master word line 360) is activated. For example, the memory device 300 may maintain the voltage on the master word line 315 below the threshold level during consecutive activate and precharge operations so long as the activate and precharge operations are for word lines coupled with the master word line 315. If a word line coupled with a different master word line (e.g., master word line 360), needs to be activated, the memory device 300 may increase the voltage on the master word line before activating that word line.

Thus, the memory device 300 maintain the voltage on a master word line at or below a threshold level in between accessing different word lines coupled with the master word line, which may improve the power efficiency associated with operating the master word line.

Figure 4:
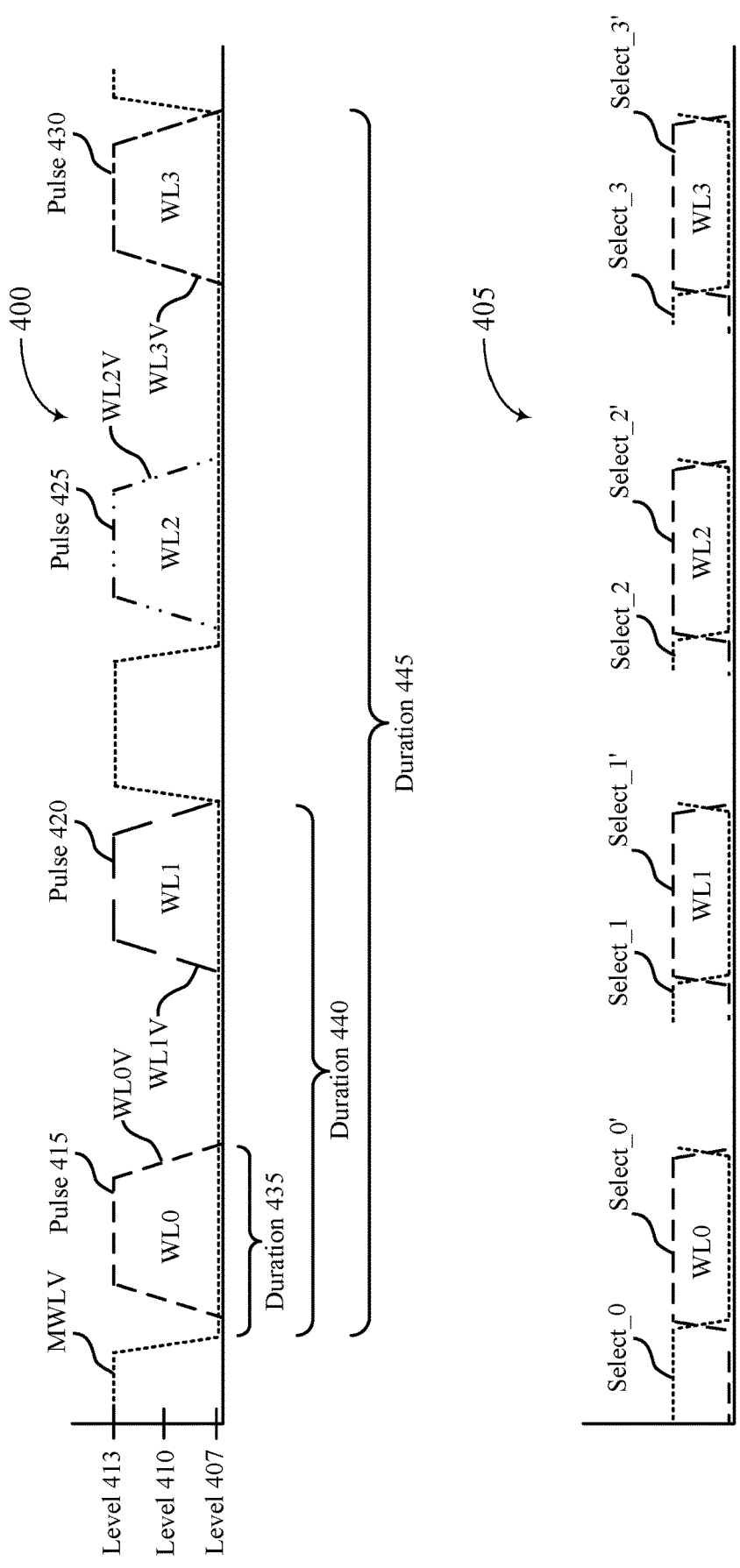
FIG. 4 illustrates an example of timing diagrams that support power-efficient access line operation in accordance with examples as disclosed herein.

FIG. 4 illustrates an example of timing diagrams 400 that supports power-efficient access line operation in accordance with examples as disclosed herein. The timing diagrams may include timing diagram 400 and timing diagram 405, which show various voltages as a function of time during a set of access operations. Although described with reference to four word lines, the techniques described herein can be implemented for any quantity of word lines.

Timing diagram 400 may include the master word line voltage, denoted MWLV, which may be the voltage on the master word line 315 that is coupled with a set of word lines (e.g., word line 0 (WL0), word line 1 (WL1), word line 2 (WL2), and word line 3 (WL3)). Timing diagram 400 may also include the voltages on the word lines coupled with the master word line. For example, timing diagram 400 may include the voltage on word line 0, denoted WL0V, the voltage on word line 1, denoted WL1V, the voltage on word line 2, denoted WL2V, and the voltage on word line 3, denoted WL3V.

Timing diagram 405 may include control voltages applied to selection circuits that are coupled with word line 0, word line 1, word line 2, and word line 3. For example, timing diagram 405 may include the voltage applied to the selection circuit for word line 0 (e.g., WL0 selection circuit 350), denoted Select_0, and the voltage applied to the pull-down component for word line 0 (e.g., switching component 355), denoted Select_0'. Timing diagram 405 may also include the voltage applied to the selection circuit for word line 1, denoted Select_1, the voltage applied to the pull-down component for word line 1, denoted Select_1', the voltage applied to the selection circuit for word line 2, denoted Select_2, the voltage applied to the pull-down component for word line 2, denoted Select_2', the voltage applied to the selection circuit for word line 3, denoted Select_3, and the voltage applied to the pull-down component for word line 3, denoted Select_3'.

In some examples, Select_0 and Select_0' are complementary voltages, Select_1 and Select_1' are complementary voltages, Select_2 and Select_2' are complementary voltages, and Select_3 and Select_3' are complementary voltages, where complementary voltages refer to voltages with an inverse relationship.

The memory device may activate a word line in response to an activate command for that word line.

To activate word line 0, the voltage on the master word line (MWLV) may be decreased to a level (e.g., level 407) below a threshold level (e.g., level 410) so that switching component 340 is deactivated (thereby decoupling word line 0 from the ground reference node) and so that switching component 335 is activated (thereby coupling word line 0 with node A). Further, Select_0 may be decreased so that WL0 selection circuit 350 is activated (thereby coupling node A with the supply line 345) and Select_0' may be increased so that switching component 355 deactivated (thereby decoupling node A from the ground reference node). In some examples, Select_0 may be decreased (and Select_0' may be increased), after decreasing the voltage on the master word line (MWLV). Thus, word line 0 may charge from the voltage of the voltage of the voltage supply 325 such that the voltage on word line 0 (WL0V) increases. Increasing the voltage on word line 0 above a threshold level (e.g., level 410) or to a threshold level (e.g., level 413) may be referred to as activating word line 0 and may activate a selection component so that a memory cell is coupled with a digit line for access.

The memory device may precharge a word line in response to a precharge command for that word line or in response to an activate command for a different word line.

To precharge word line 0, Select_0 may be increased so that WL0 selection circuit 350 is deactivated (thereby decoupling node A from the supply line 345) and Select_0' may be decreased so that switching component 355 is activated (thereby coupling node A with the ground reference node). Additionally, the voltage on the master word line (MWLV) may be increased to a level (e.g., level 413) above a threshold level (e.g., level 410 or another intermediate level between 407 and 413) so that switching component 340 is activated (thereby coupling word line 0 with the ground reference node) and so that switching component 335 is deactivated (thereby decoupling word line 0 from node A). In some examples, Select_0 may be decreased (and Select_0' may be increased), before increasing the voltage on the master word line (MWLV).

Similar processes may be used to activate and precharge other word lines that are coupled with the master word line 315.

So, the memory device may pulse (e.g., increase then decrease) the voltage on word line x (e.g., WLxV) in order to access the memory cell coupled with word line x. And to access memory cells coupled with other word lines, the memory device pulse the voltage on those word lines. For example, to access the memory cells coupled with word line 0, word line 1, word line 2, and word line 3, in that order, the memory device may pulse the voltage on word line 0 (WL0V), then pulse the voltage on word line 1 (WLV1), then pulse the voltage on word line 2 (WLV2), then pulse the voltage on word line 3 (WLV3). Put another way, the memory device may generate, in order, pulse 415, pulse 420, pulse 425, and pulse 430.

Rather than increasing the voltage on the master word line (MWLV) in between each word line pulse, which may consume power, the memory device may maintain the voltage on the master word line (MWLV) below a threshold level (e.g., below level 410) in between word line pulses. For instance, the memory device may maintain the voltage on the master word line (MWLV) at or around level 407 in between two or more word line pulses. To illustrate, the voltage on the master word line (MWLV) may be maintained below the threshold level in between two consecutive word line pulses (e.g., pulse 415 and pulse 420). Thus, the voltage on the master word line (MWLV) may be maintained below the threshold level for duration 440, rather than for duration 435 (which corresponds to increasing MWLV in between pulse 415 and pulse 420). As another illustration, the voltage on the master word line (MWLV) may be maintained below the threshold level in between four consecutive word line pulses (e.g., pulse 415, pulse 420, pulse 425, pulse 430). In such an example, the voltage on the master word line (MWLV) may be maintained below the threshold level for duration 445.

The memory device may determine to maintain MWLV below the threshold level (in between pulses/activations) before decreasing MWLV to level 407 or after decreasing MWLV to level 407.

The memory device may determine to maintain MWLV below the threshold level (in between pulses/activations) based on one or more conditions. In one example, the memory device may determine to maintain MWLV below the threshold level if consecutively received activate commands are determined to be for word lines that are coupled with the same master word line (e.g., master word line 315). In another example, the memory device may determine to maintain MWLV below the threshold level if the memory device receives a refresh command for the master word line 315. In response to the refresh command from the host device, the memory device may issue multiple internal refresh commands (possibly according to a predetermined pattern or sequence) to consecutively access the word lines coupled with the master word line 315.

The memory device may determine to increase MWLV above the threshold level (e.g., to level 413) based on a precharge command for the master word line 315 or based on an activate command for a different master word line. In the latter example, the memory device may ignore precharge commands for the master word line 315 and delay increasing MWLV above the threshold level until an activate command for a different master word line is received.

Thus, a memory device may implement aspects of the timing diagram 400 and the timing diagram 405 to reduce the power consumption associated with operation of the master word line.

Figure 5:
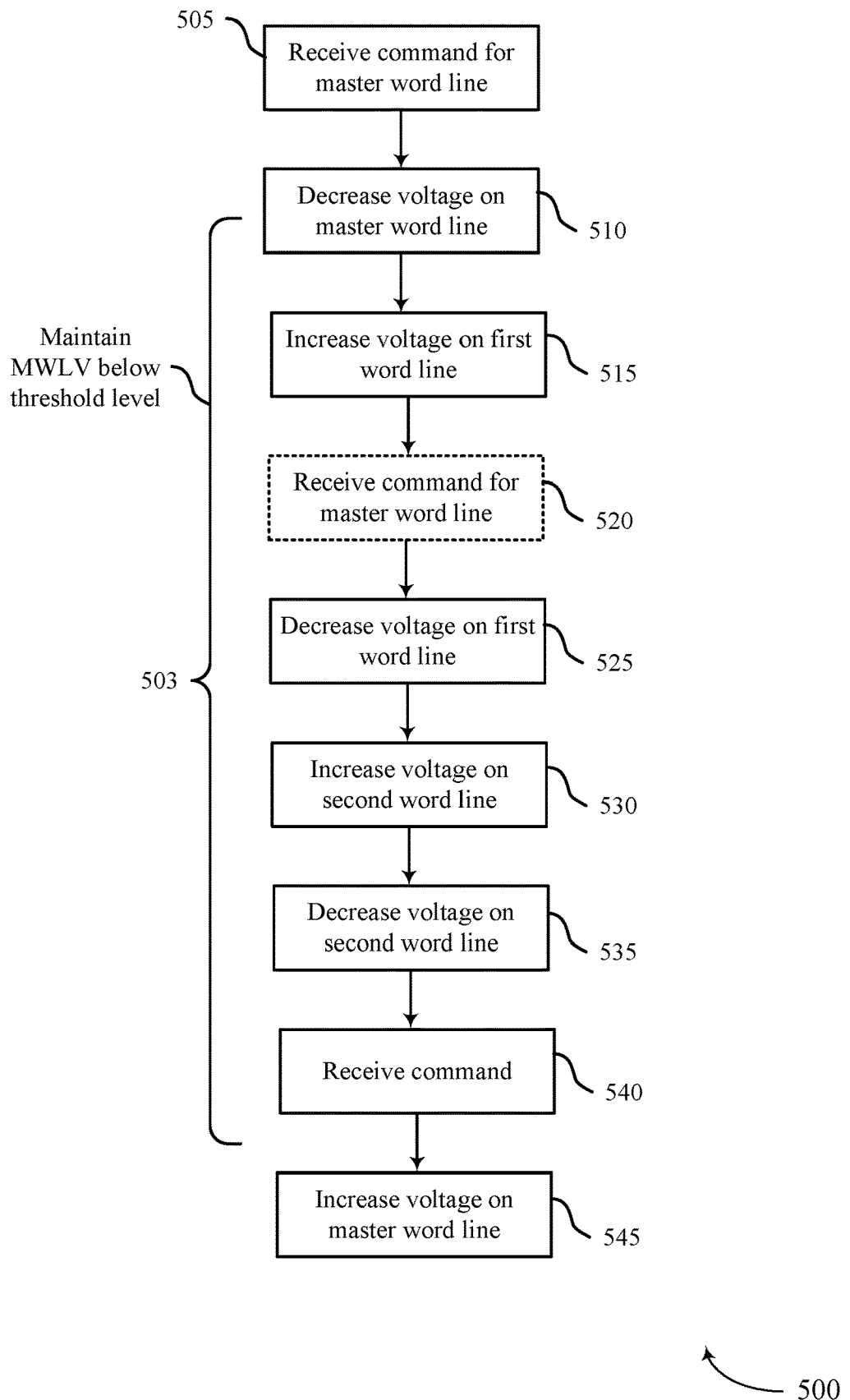
FIG. 5 illustrates an example of a process flow that supports power-efficient access line operation for memory in accordance with examples as disclosed herein.

FIG. 5 illustrates an example of a process flow 500 that supports power-efficient access line operation for memory in accordance with examples as disclosed herein. The process flow 500 may be implemented by a memory device as described herein. By implementing the process flow 500, the memory device may maintain the voltage of the master word line below a threshold level in between consecutive activations of word lines, which may reduce the power consumption associated with operation of the master word line.

At 505, a command may be received (e.g., by the memory device). The command may be an activate command for a first word line coupled with a master word line or the command may be a refresh command for the master word line. At 510, the voltage on the master word line may be decreased below a threshold level (e.g., level 410). The voltage on the master word line may be decreased based on (e.g., in response to) the command received at 505.

After 510, for duration 503, the voltage on the master word line may be maintained below the threshold level. In some examples, the memory device may maintain the voltage on the master word line below the threshold level based on determining that multiple word lines coupled with the same master word line are to be consecutively activated. For example, the memory device may determine whether two or more word lines for activation are in the set of word lines coupled with the master word line and, if so, the memory device may maintain the voltage on the master word line below the threshold level in between activating the two or more word lines. In some examples, the memory device may maintain the voltage on the master word line below the threshold level based on the command at 505 being a refresh command. In some examples, the memory device may maintain the voltage on the master word line below the threshold level based on the command at 505 and the command at 520 being activate commands for the master word line.

In some examples, the threshold level (e.g., level 410) may be the level below which a switching component (e.g., switching component 335) between the first word line and a voltage supply is activated. Put another way, the threshold level may be the level above which the switching component (e.g., switching component 335) between the first word line and the voltage supply is deactivated.

At 515, the voltage on the first word line coupled with the master word line may be increased (e.g., to level 413). Increasing the voltage on the first word line may also be referred to as activating the first word line.

In some examples, the voltage on the first word line may be increased by or based on coupling the first word line with the voltage supply. In some examples, the voltage on the first word line may be increased by or based on decoupling (e.g., isolating) the first word line from a ground reference. Increasing the voltage on the first word line may couple a first memory cell with a first digit line. Thus, the memory device may access the first memory cell (which is coupled with the first word line) based on increasing the voltage on the first word line. At 520, a command may be received (e.g., by the memory device). In some examples, the command may be an activate command for a second word line coupled with the master word line. In some examples, the command received at 520 may be received before 510 or between 510 and 515. In some examples, the command received at 505 and the command received at 520 may be received consecutively for the master word line.

At 525, the voltage on the first word line may be decreased (e.g., to level 407). Decreasing the voltage on the first word line may also be referred to as deactivating the first word line. Increasing the voltage on the first word line at 515 and decreasing the voltage on the first word line at 525 may be referred to as driving a voltage pulse on the first word line.

At 530, the voltage on the second word line may be increased (e.g., to level 413). Increasing the voltage on the second word line may also be referred to as activating the second word line.

In some examples, the voltage on the second word line may be increased by or based on coupling the second word line with the voltage supply. In some examples, the voltage on the second word line may be increased by or based on decoupling (e.g., isolating) the second word line from a ground reference. Increasing the voltage on the second word line may couple a second memory cell with a second digit line. Thus, the memory device may access the second memory cell (which is coupled with the second word line) based on increasing the voltage on the second word line.

At 535, the voltage on the second word line may be decreased (e.g., to level 407). Decreasing the voltage on the second word line may also be referred to as deactivating the second word line. Increasing the voltage on the second word line at 530 and decreasing the voltage on the second word line at 535 may be referred to as driving a voltage pulse on the second word line.

At 540, a command may be received (e.g., by the memory device). The command may be a precharge command for the master word line (e.g., a precharge command for the second word line) or the command may be an activate command for a second master word line (e.g., the command may be an activate command for a word line coupled with the second master word line).

At 545, the voltage on the master word line may be increased above the threshold level (e.g., to level 413). The voltage on the master word line may be increased based on the command at 540 being a precharge command for the master word line or being an activate command for the second master word line. In some examples (e.g., if the command at 540 is an activate command for the second master word line), the voltage on the master word line may be increased concurrently (e.g., at partially or wholly overlapping times) with decreasing the voltage on the second master word line below the threshold level.

Thus, the memory device may maintain the voltage of the master word line below a threshold level in between consecutive activations of word lines, which may reduce the power consumption associated with operation of the master word line.

Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 6:
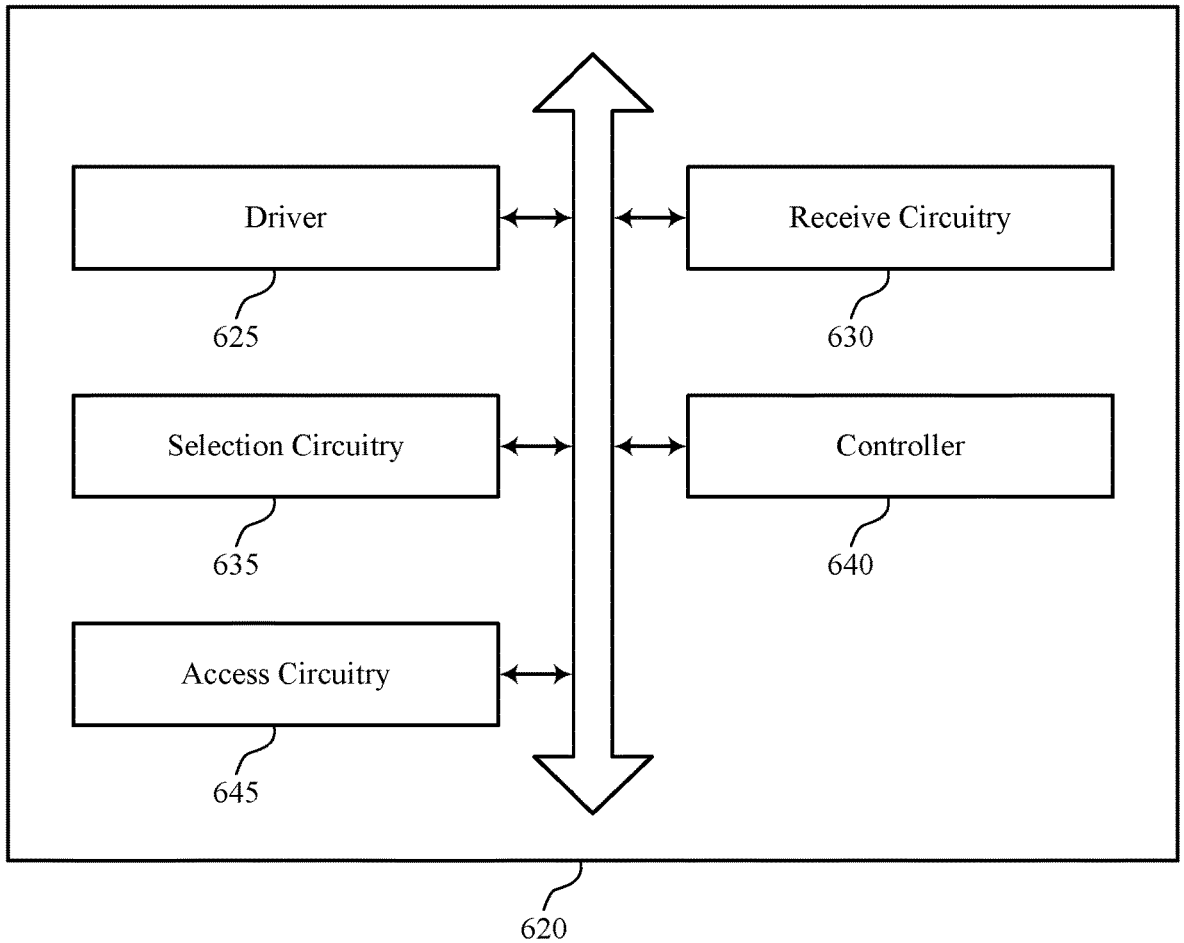
FIG. 6 shows a block diagram of a memory device that supports power-efficient access line operation for memory in accordance with examples as disclosed herein.

FIG. 6 shows a block diagram 600 of a memory device 620 that supports power-efficient access line operation for memory in accordance with examples as disclosed herein. The memory device 620 may be an example of aspects of a memory device as described with reference to FIGS. 1 through 5. The memory device 620, or various components thereof, may be an example of means for performing various aspects of power-efficient access line operation for memory as described herein. For example, the memory device 620 may include a driver 625, a receive circuitry 630, a selection circuitry 635, a controller 640, an access circuitry 645, or any combination thereof. Each of these components may communicate, directly or indirectly, with one another (e.g., via one or more buses).

The driver 625 may be configured as or otherwise support a means for decreasing a voltage on a master word line below a threshold level, the master word line coupled with a set of word lines. In some examples, the driver 625 may be configured as or otherwise support a means for increasing, while the voltage on the master word line is maintained below the threshold level, a voltage on a first word line of the set of word lines and a voltage on a second word line of the set of word lines. In some examples, the driver 625 may be configured as or otherwise support a means for increasing the voltage on the master word line above the threshold level after increasing the voltage on the second word line.

In some examples, the voltage on the second word line is increased after the voltage on the first word line is increased.

In some examples, the driver 625 may be configured as or otherwise support a means for maintaining, based at least in part on the first word line and the second word line being in the set of word lines coupled with the master word line, the voltage on the master word line below the threshold level after increasing the voltage on the first word line and before increasing the voltage on the second word line.

In some examples, the receive circuitry 630 may be configured as or otherwise support a means for receiving, consecutively for the master word line, a first activate command for the first word line and a second activate command for the second word line, where the voltage on the first word line is increased based at least in part on the first activate command and the voltage on the second word line is increased based at least in part on the second activate command. In some examples, the driver 625 may be configured as or otherwise support a means for maintaining the voltage on the master word line below the threshold level based at least in part on the first activate command and the second activate command being consecutively received.

In some examples, the receive circuitry 630 may be configured as or otherwise support a means for receiving a refresh command for the master word line, where the voltage on the first word line and the voltage on the second word line are increased based at least in part on the refresh command. In some examples, the driver 625 may be configured as or otherwise support a means for maintaining the voltage on the master word line below the threshold level based at least in part on the refresh command.

In some examples, the receive circuitry 630 may be configured as or otherwise support a means for receiving an activate command for a second master word line, where the voltage on the master word line is increased based at least in part on the activate command for the second master word line.

In some examples, the driver 625 may be configured as or otherwise support a means for decreasing the voltage on the first word line before increasing the voltage on the second word line, where the voltage on the master word line is maintained below the threshold level during the decreasing of the voltage on the first word line.

In some examples, the driver 625 may be configured as or otherwise support a means for decreasing the voltage on the second word line after increasing the voltage on the second word line, where the voltage on the master word line is maintained below the threshold level while decreasing of the voltage on the second word line.

In some examples, the selection circuitry 635 may be configured as or otherwise support a means for coupling the first word line to a voltage supply based at least in part on decreasing the voltage on the master word line, where the voltage on the first word line is based at least in part on the voltage supply. In some examples, the selection circuitry 635 may be configured as or otherwise support a means for coupling the second word line to the voltage supply based at least in part on decreasing the voltage on the master word line, where the voltage on the second word line is based at least in part on the voltage supply.

In some examples, the threshold level includes a level below which a switching component between the first word line and a voltage supply is activated.

In some examples, increasing the voltage on the first word line couples a first memory cell with a first digit line. In some examples, increasing the voltage on the second word line couples a second memory cell with a second digit line.

In some examples, the driver 625 may be configured as or otherwise support a means for driving a voltage pulse on a first word line included in a set of word lines that is coupled with a master word line, where driving the voltage pulse on the first word line includes increasing then decreasing a voltage on the first word line. In some examples, the driver 625 may be configured as or otherwise support a means for driving, after driving the voltage pulse on the first word line, a voltage pulse on a second word line included in the set of word lines, where driving the voltage pulse on the second word line includes increasing then decreasing a voltage on the second word line. In some examples, the driver 625 may be configured as or otherwise support a means for maintaining, in between driving the voltage pulse on the first word line and driving the voltage pulse on the second word line, a voltage on the master word line below a threshold level, where the threshold level includes a level below which a switching component between the first word line and a voltage supply is activated.

In some examples, increasing the voltage on the first word line couples a first memory cell with a first digit line. In some examples, increasing the voltage on the second word line couples a second memory cell with a second digit line.

In some examples, the controller 640 may be configured as or otherwise support a means for determining whether the first word line and the second word line are in the set of word lines coupled with the master word line, where the voltage on the master word line is maintained below the threshold level based at least in part on the first word line and the second word line being in the set of word lines coupled with the master word line.

In some examples, the receive circuitry 630 may be configured as or otherwise support a means for receiving a command for the master word line, where the voltage on the master word line is maintained below the threshold level based at least in part on the command being a refresh command.

In some examples, the receive circuitry 630 may be configured as or otherwise support a means for receiving an activate command for a second master word line after driving the voltage pulse on the second word line. In some examples, the driver 625 may be configured as or otherwise support a means for increasing the voltage on the master word line above the threshold level based at least in part on the activate command being for the second master word line.

In some examples, the driver 625 may be configured as or otherwise support a means for decreasing, concurrent with increasing the voltage on the master word line, a voltage on the second master word line based at least in part on the activate command.

In some examples, the selection circuitry 635 may be configured as or otherwise support a means for coupling the first word line with a voltage supply based at least in part on decreasing the voltage on the master word line below the threshold level, where the voltage on the first word line is increased based at least in part on coupling the first word line with the voltage supply. In some examples, the driver 625 may be configured as or otherwise support a means for decoupling the first word line from a ground reference node based at least in part on decreasing the voltage on the master word line below the threshold level, where the voltage on the first word line is increased based at least in part on decoupling the first word line from the ground reference node.

In some examples, the receive circuitry 630 may be configured as or otherwise support a means for receiving an activate command for the master word line. In some examples, the driver 625 may be configured as or otherwise support a means for decreasing, based at least in part on the activate command, the voltage on the master word line below the threshold level before driving the voltage pulse on the first word line.

In some examples, the access circuitry 645 may be configured as or otherwise support a means for accessing a first memory cell coupled with the first word line based at least in part on increasing the voltage on the first word line. In some examples, the access circuitry 645 may be configured as or otherwise support a means for accessing a second memory cell coupled with the second word line based at least in part on increasing the voltage on the second word line.

The receive circuitry 630 may be configured as or otherwise support a means for receiving a command for a master word line coupled with a first word line and a second word line. In some examples, the driver 625 may be configured as or otherwise support a means for decreasing a voltage on the master word line below a threshold level based at least in part on the command, where a switching component coupled with the master word line and a voltage supply is activated based at least in part on decreasing the voltage on the master word line below the threshold level. In some examples, the driver 625 may be configured as or otherwise support a means for activating the first word line and the second word line after decreasing the voltage on the master word line. In some examples, the driver 625 may be configured as or otherwise support a means for maintaining the voltage on the master word line below the threshold level in between activating the first word line and the second word line.

In some examples, the controller 640 may be configured as or otherwise support a means for determining that the command is a refresh command, where the voltage on the master word line is maintained below the threshold level based at least in part on determining that the command is the refresh command.

In some examples, the command includes an activate command for the first word line, and the receive circuitry 630 may be configured as or otherwise support a means for receiving a second activate command for the second word line, where the voltage on the master word line is maintained below the threshold level based at least in part on the activate command and the second activate command being for the master word line.

In some examples, the receive circuitry 630 may be configured as or otherwise support a means for receiving a precharge command for the master word line after receiving the command, the precharge command indicating that the voltage on the master word line is to be increased above the threshold level. In some examples, the controller 640 may be configured as or otherwise support a means for delaying increasing the voltage on the master word line above the threshold level until an activate command for a second master word line is received.

In some examples, the driver 625 may be configured as or otherwise support a means for activating a third word line coupled with the master word line, where the voltage on the master word line is maintained below the threshold level in between activating the second word line and the third word line.

In some examples, the driver 625 may be configured as or otherwise support a means for deactivating the first word line and the second word line, where the first word line is activated and deactivated before the second word line is activated and deactivated.

Figure 7:
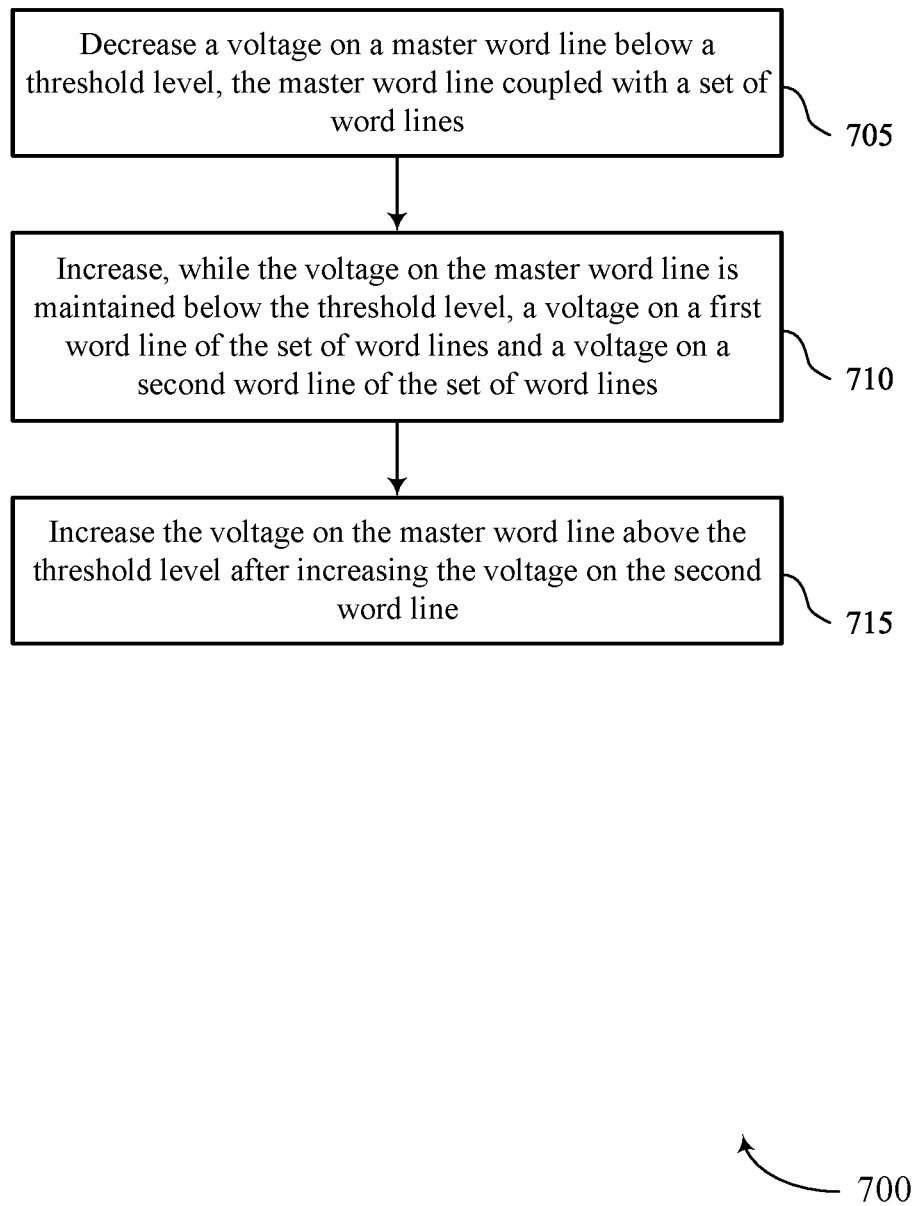
FIGS. 7 through 9 show flowcharts illustrating a method or methods that support power-efficient access line operation for memory in accordance with examples as disclosed herein.

FIG. 7 shows a flowchart illustrating a method 700 that supports power-efficient access line operation for memory in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 705, the method may include decreasing a voltage on a master word line below a threshold level, the master word line coupled with a set of word lines. The operations of 705 may be performed in accordance with examples as disclosed herein. In some examples, aspects of the operations of 705 may be performed by a driver 625 as described with reference to FIG. 6.

At 710, the method may include increasing, while the voltage on the master word line is maintained below the threshold level, a voltage on a first word line of the set of word lines and a voltage on a second word line of the set of word lines. The operations of 710 may be performed in accordance with examples as disclosed herein. In some examples, aspects of the operations of 710 may be performed by a driver 625 as described with reference to FIG. 6.

At 715, the method may include increasing the voltage on the master word line above the threshold level after increasing the voltage on the second word line. The operations of 715 may be performed in accordance with examples as disclosed herein. In some examples, aspects of the operations of 715 may be performed by a driver 625 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for decreasing a voltage on a master word line below a threshold level, the master word line coupled with a set of word lines; increasing, while the voltage on the master word line is maintained below the threshold level, a voltage on a first word line of the set of word lines and a voltage on a second word line of the set of word lines; and increasing the voltage on the master word line above the threshold level after increasing the voltage on the second word line.

Aspect 2: The method, apparatus, or non-transitory computer-readable medium of aspect 1 where the voltage on the second word line is increased after the voltage on the first word line is increased.

Aspect 3: The method, apparatus, or non-transitory computer-readable medium of any of aspects 1 through 2, further including operations, features, circuitry, logic, means, or instructions, or any combination thereof for maintaining, based at least in part on the first word line and the second word line being in the set of word lines coupled with the master word line, the voltage on the master word line below the threshold level after increasing the voltage on the first word line and before increasing the voltage on the second word line.

Aspect 4: The method, apparatus, or non-transitory computer-readable medium of any of aspects 1 through 3, further including operations, features, circuitry, logic, means, or instructions, or any combination thereof for receiving, consecutively for the master word line, a first activate command for the first word line and a second activate command for the second word line, where the voltage on the first word line is increased based at least in part on the first activate command and the voltage on the second word line is increased based at least in part on the second activate command and maintaining the voltage on the master word line below the threshold level based at least in part on the first activate command and the second activate command being consecutively received.

Aspect 5: The method, apparatus, or non-transitory computer-readable medium of any of aspects 1 through 4, further including operations, features, circuitry, logic, means, or instructions, or any combination thereof for receiving a refresh command for the master word line, where the voltage on the first word line and the voltage on the second word line are increased based at least in part on the refresh command and maintaining the voltage on the master word line below the threshold level based at least in part on the refresh command.

Aspect 6: The method, apparatus, or non-transitory computer-readable medium of any of aspects 1 through 5, further including operations, features, circuitry, logic, means, or instructions, or any combination thereof for receiving an activate command for a second master word line, where the voltage on the master word line is increased based at least in part on the activate command for the second master word line.

Aspect 7: The method, apparatus, or non-transitory computer-readable medium of any of aspects 1 through 6, further including operations, features, circuitry, logic, means, or instructions, or any combination thereof for decreasing the voltage on the first word line before increasing the voltage on the second word line, where the voltage on the master word line is maintained below the threshold level during the decreasing of the voltage on the first word line.

Aspect 8: The method, apparatus, or non-transitory computer-readable medium of aspect 7, further including operations, features, circuitry, logic, means, or instructions, or any combination thereof for decreasing the voltage on the second word line after increasing the voltage on the second word line, where the voltage on the master word line is maintained below the threshold level while decreasing of the voltage on the second word line.

Aspect 9: The method, apparatus, or non-transitory computer-readable medium of any of aspects 1 through 8, further including operations, features, circuitry, logic, means, or instructions, or any combination thereof for coupling the first word line to a voltage supply based at least in part on decreasing the voltage on the master word line, where the voltage on the first word line is based at least in part on the voltage supply and coupling the second word line to the voltage supply based at least in part on decreasing the voltage on the master word line, where the voltage on the second word line is based at least in part on the voltage supply.

Aspect 10: The method, apparatus, or non-transitory computer-readable medium of any of aspects 1 through 9 where the threshold level includes a level below which a switching component between the first word line and a voltage supply is activated.

Aspect 11: The method, apparatus, or non-transitory computer-readable medium of any of aspects 1 through 10 where increasing the voltage on the first word line couples a first memory cell with a first digit line and increasing the voltage on the second word line couples a second memory cell with a second digit line.

Figure 8:
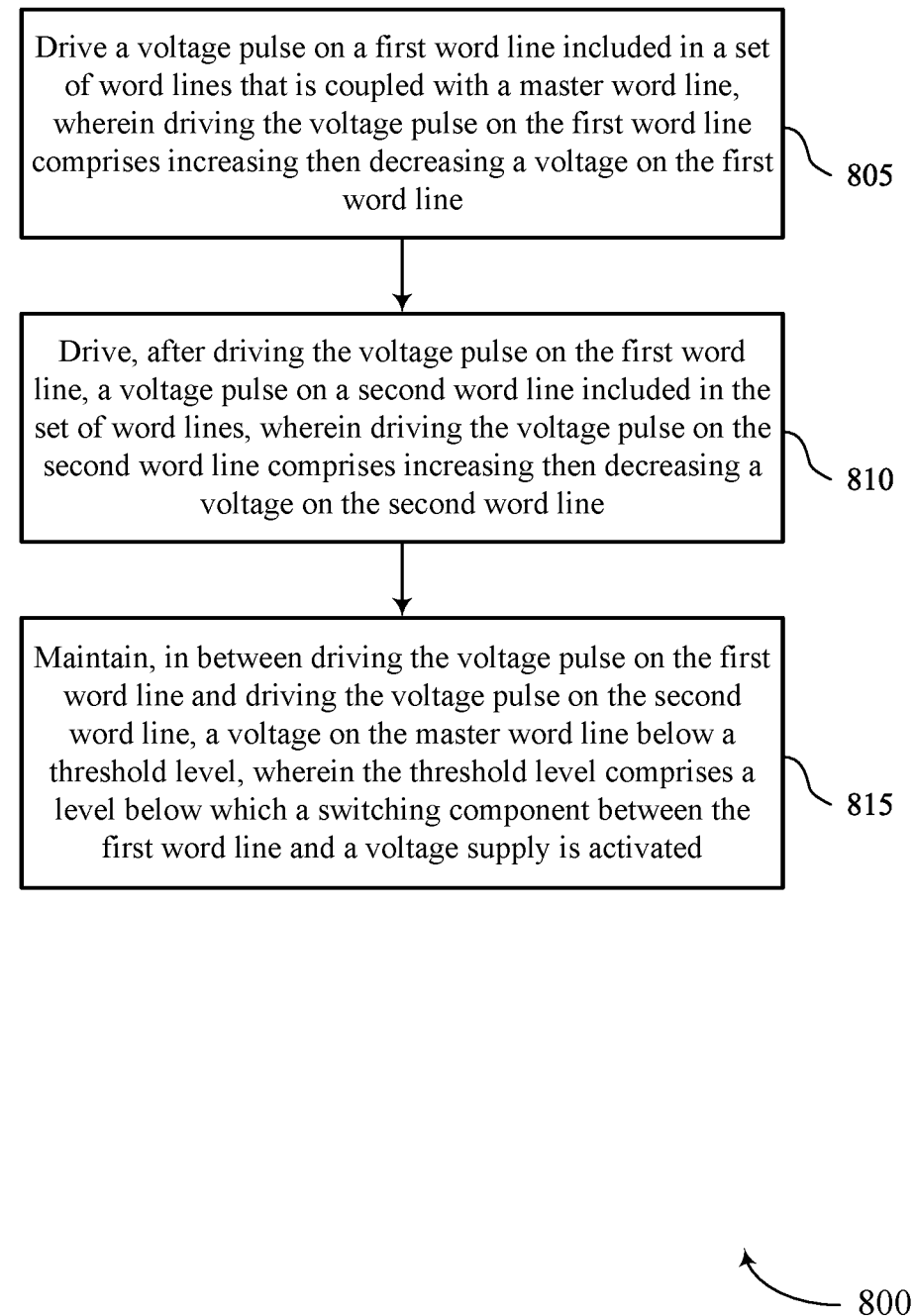

FIG. 8 shows a flowchart illustrating a method 800 that supports power-efficient access line operation for memory in accordance with examples as disclosed herein. The operations of method 800 may be implemented by a memory device or its components as described herein. For example, the operations of method 800 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 805, the method may include driving a voltage pulse on a first word line included in a set of word lines that is coupled with a master word line, where driving the voltage pulse on the first word line includes increasing then decreasing a voltage on the first word line. The operations of 805 may be performed in accordance with examples as disclosed herein. In some examples, aspects of the operations of 805 may be performed by a driver 625 as described with reference to FIG. 6.

At 810, the method may include driving, after driving the voltage pulse on the first word line, a voltage pulse on a second word line included in the set of word lines, where driving the voltage pulse on the second word line includes increasing then decreasing a voltage on the second word line. The operations of 810 may be performed in accordance with examples as disclosed herein. In some examples, aspects of the operations of 810 may be performed by a driver 625 as described with reference to FIG. 6.

At 815, the method may include maintaining, in between driving the voltage pulse on the first word line and driving the voltage pulse on the second word line, a voltage on the master word line below a threshold level, where the threshold level includes a level below which a switching component between the first word line and a voltage supply is activated. The operations of 815 may be performed in accordance with examples as disclosed herein. In some examples, aspects of the operations of 815 may be performed by a driver 625 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 12: A method, apparatus, or non-transitory computer-readable medium including operations, features, circuitry, logic, means, or instructions, or any combination thereof for driving a voltage pulse on a first word line included in a set of word lines that is coupled with a master word line, where driving the voltage pulse on the first word line includes increasing then decreasing a voltage on the first word line; driving, after driving the voltage pulse on the first word line, a voltage pulse on a second word line included in the set of word lines, where driving the voltage pulse on the second word line includes increasing then decreasing a voltage on the second word line; and maintaining, in between driving the voltage pulse on the first word line and driving the voltage pulse on the second word line, a voltage on the master word line below a threshold level, where the threshold level includes a level below which a switching component between the first word line and a voltage supply is activated.

Aspect 13: The method, apparatus, or non-transitory computer-readable medium of aspect 12 where increasing the voltage on the first word line couples a first memory cell with a first digit line and increasing the voltage on the second word line couples a second memory cell with a second digit line.

Aspect 14: The method, apparatus, or non-transitory computer-readable medium of any of aspects 12 through 13, further including operations, features, circuitry, logic, means, or instructions, or any combination thereof for determining whether the first word line and the second word line are in the set of word lines coupled with the master word line, where the voltage on the master word line is maintained below the threshold level based at least in part on the first word line and the second word line being in the set of word lines coupled with the master word line.

Aspect 15: The method, apparatus, or non-transitory computer-readable medium of any of aspects 12 through 14, further including operations, features, circuitry, logic, means, or instructions, or any combination thereof for receiving a command for the master word line, where the voltage on the master word line is maintained below the threshold level based at least in part on the command being a refresh command.

Aspect 16: The method, apparatus, or non-transitory computer-readable medium of any of aspects 12 through 15, further including operations, features, circuitry, logic, means, or instructions, or any combination thereof for receiving an activate command for a second master word line after driving the voltage pulse on the second word line and increasing the voltage on the master word line above the threshold level based at least in part on the activate command being for the second master word line.

Aspect 17: The method, apparatus, or non-transitory computer-readable medium of aspect 16, further including operations, features, circuitry, logic, means, or instructions, or any combination thereof for decreasing, concurrent with increasing the voltage on the master word line, a voltage on the second master word line based at least in part on the activate command.

Aspect 18: The method, apparatus, or non-transitory computer-readable medium of any of aspects 12 through 17, further including operations, features, circuitry, logic, means, or instructions, or any combination thereof for coupling the first word line with a voltage supply based at least in part on decreasing the voltage on the master word line below the threshold level, where the voltage on the first word line is increased based at least in part on coupling the first word line with the voltage supply and decoupling the first word line from a ground reference node based at least in part on decreasing the voltage on the master word line below the threshold level, where the voltage on the first word line is increased based at least in part on decoupling the first word line from the ground reference node.

Aspect 19: The method, apparatus, or non-transitory computer-readable medium of any of aspects 12 through 18, further including operations, features, circuitry, logic, means, or instructions, or any combination thereof for receiving an activate command for the master word line and decreasing, based at least in part on the activate command, the voltage on the master word line below the threshold level before driving the voltage pulse on the first word line.

Aspect 20: The method, apparatus, or non-transitory computer-readable medium of any of aspects 12 through 19, further including operations, features, circuitry, logic, means, or instructions, or any combination thereof for accessing a first memory cell coupled with the first word line based at least in part on increasing the voltage on the first word line and accessing a second memory cell coupled with the second word line based at least in part on increasing the voltage on the second word line.

Figure 9:
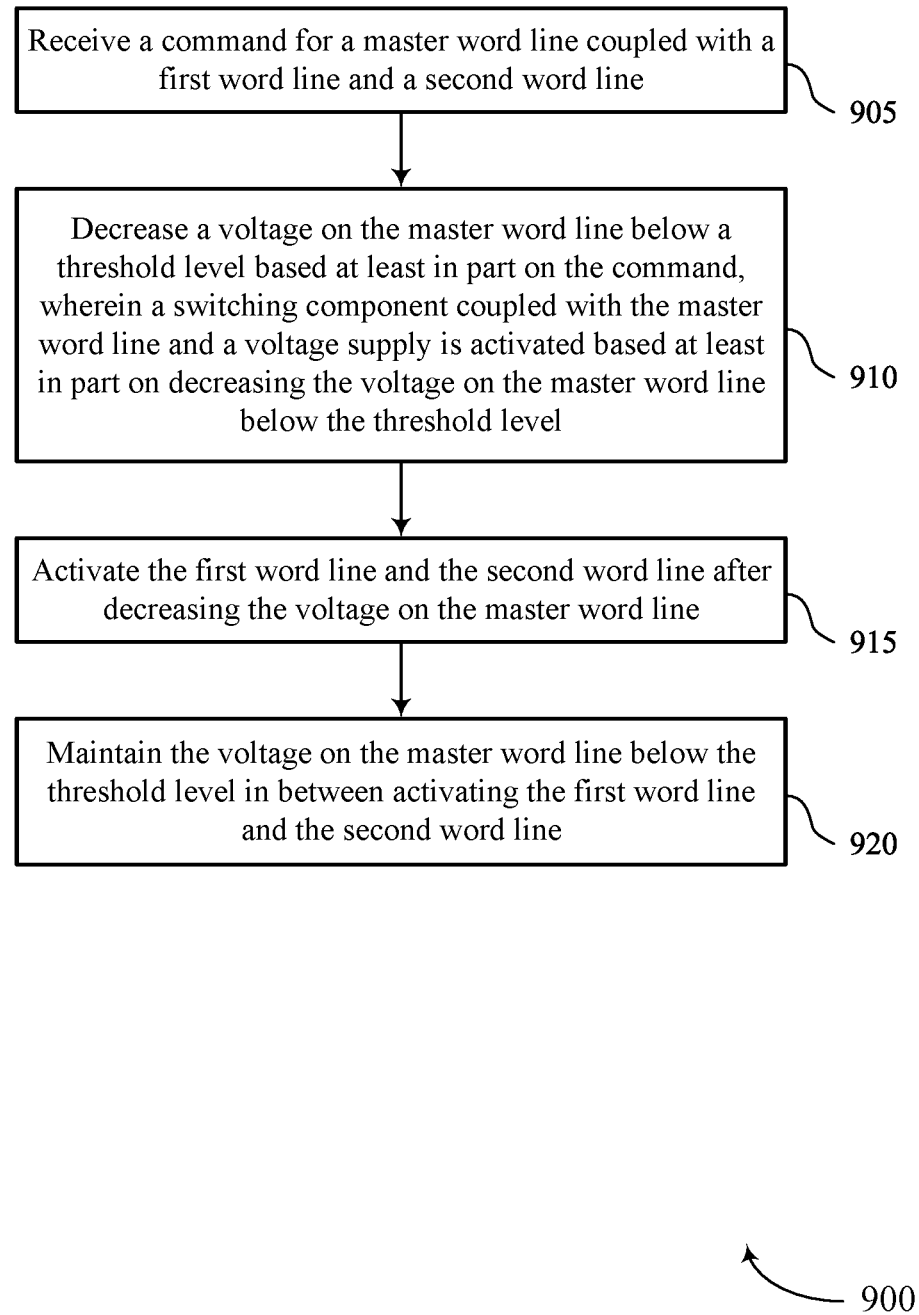

FIG. 9 shows a flowchart illustrating a method 900 that supports power-efficient access line operation for memory in accordance with examples as disclosed herein. The operations of method 900 may be implemented by a memory device or its components as described herein. For example, the operations of method 900 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 905, the method may include receiving a command for a master word line coupled with a first word line and a second word line. The operations of 905 may be performed in accordance with examples as disclosed herein. In some examples, aspects of the operations of 905 may be performed by a receive circuitry 630 as described with reference to FIG. 6.

At 910, the method may include decreasing a voltage on the master word line below a threshold level based at least in part on the command, where a switching component coupled with the master word line and a voltage supply is activated based at least in part on decreasing the voltage on the master word line below the threshold level. The operations of 910 may be performed in accordance with examples as disclosed herein. In some examples, aspects of the operations of 910 may be performed by a driver 625 as described with reference to FIG. 6.

At 915, the method may include activating the first word line and the second word line after decreasing the voltage on the master word line. The operations of 915 may be performed in accordance with examples as disclosed herein. In some examples, aspects of the operations of 915 may be performed by a driver 625 as described with reference to FIG. 6.

At 920, the method may include maintaining the voltage on the master word line below the threshold level in between activating the first word line and the second word line. The operations of 920 may be performed in accordance with examples as disclosed herein. In some examples, aspects of the operations of 920 may be performed by a driver 625 as described with reference to FIG. 6.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 21: A method, apparatus, or non-transitory computer-readable medium including operations, features, circuitry, logic, means, or instructions, or any combination thereof for receiving a command for a master word line coupled with a first word line and a second word line; decreasing a voltage on the master word line below a threshold level based at least in part on the command, where a switching component coupled with the master word line and a voltage supply is activated based at least in part on decreasing the voltage on the master word line below the threshold level; activating the first word line and the second word line after decreasing the voltage on the master word line; and maintaining the voltage on the master word line below the threshold level in between activating the first word line and the second word line.

Aspect 22: The method, apparatus, or non-transitory computer-readable medium of aspect 21, further including operations, features, circuitry, logic, means, or instructions, or any combination thereof for determining that the command is a refresh command, where the voltage on the master word line is maintained below the threshold level based at least in part on determining that the command is the refresh command.

Aspect 23: The method, apparatus, or non-transitory computer-readable medium of any of aspects 21 through 22 where the command includes an activate command for the first word line and the method, apparatuses, and non-transitory computer-readable medium, further includes operations, features, circuitry, logic, means, or instructions, or any combination thereof for receiving a second activate command for the second word line, where the voltage on the master word line is maintained below the threshold level based at least in part on the activate command and the second activate command being for the master word line.

Aspect 24: The method, apparatus, or non-transitory computer-readable medium of any of aspects 21 through 23, further including operations, features, circuitry, logic, means, or instructions, or any combination thereof for receiving a precharge command for the master word line after receiving the command, the precharge command indicating that the voltage on the master word line is to be increased above the threshold level and delaying increasing the voltage on the master word line above the threshold level until an activate command for a second master word line is received.

Aspect 25: The method, apparatus, or non-transitory computer-readable medium of any of aspects 21 through 24, further including operations, features, circuitry, logic, means, or instructions, or any combination thereof for activating a third word line coupled with the master word line, where the voltage on the master word line is maintained below the threshold level in between activating the second word line and the third word line.

Aspect 26: The method, apparatus, or non-transitory computer-readable medium of any of aspects 21 through 25, further including operations, features, circuitry, logic, means, or instructions, or any combination thereof for deactivating the first word line and the second word line, where the first word line is activated and deactivated before the second word line is activated and deactivated.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 27: An apparatus, including: a master word line coupled with a set of word lines; and a controller configured to cause the apparatus to: decrease a voltage on the master word line below a threshold level; increase, while the voltage on the master word line is maintained below the threshold level, a voltage on a first word line of the set of word lines and a voltage on a second word line of the set of word lines; and increase the voltage on the master word line above the threshold level after increasing the voltage on the first word line.

Aspect 28: The apparatus of aspect 27, where the controller is further configured to cause the apparatus to: maintain, based at least in part on the first word line and the second word line being in the set of word lines coupled with the master word line, the voltage on the master word line below the threshold level in between increasing the voltage on the first word line and increasing the voltage on the second word line.

An apparatus is described. The following provides an overview of aspects of the apparatus as described herein:

Aspect 29: An apparatus, including: a master word line coupled with a set of word lines; and a controller configured to cause the apparatus to: drive a voltage pulse on a first word line included in the set of word lines that is coupled with the master word line, where driving the voltage pulse on the first word line includes increasing then decreasing a voltage on the first word line; drive, after driving the voltage pulse on the first word line, a voltage pulse on a second word line included in the set of word lines, where driving the voltage pulse on the second word line includes increasing then decreasing a voltage on the second word line; and maintain, in between driving the voltage pulse on the first word line and driving the voltage pulse on the second word line, a voltage on the master word line below a threshold level, where the threshold level includes a level below which a switching component between the first word line and a voltage supply is activated.

Aspect 30: The apparatus of aspect 29, where the controller is further configured to: determine that the first word line and the second word line are in the set of word lines coupled with the master word line, where the voltage on the master word line is maintained below the threshold level based at least in part on the first word line and the second word line being in the set of word lines coupled with the master word line.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to the condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
decreasing a voltage on a master word line below a threshold level, the master word line coupled with a set of word lines;
increasing, while the voltage on the master word line is maintained below the threshold level, a voltage on a first word line of the set of word lines and a voltage on a second word line of the set of word lines; and
increasing the voltage on the master word line above the threshold level after increasing the voltage on the second word line.

2. The method of claim 1, wherein the voltage on the second word line is increased after the voltage on the first word line is increased.

3. The method of claim 1, further comprising:
maintaining, based at least in part on the first word line and the second word line being in the set of word lines coupled with the master word line, the voltage on the master word line below the threshold level after increasing the voltage on the first word line and before increasing the voltage on the second word line.

4. The method of claim 1, further comprising:
receiving, consecutively for the master word line, a first activate command for the first word line and a second activate command for the second word line, wherein the voltage on the first word line is increased based at least in part on the first activate command and the voltage on the second word line is increased based at least in part on the second activate command; and
maintaining the voltage on the master word line below the threshold level based at least in part on the first activate command and the second activate command being consecutively received.

5. The method of claim 1, further comprising:
receiving a refresh command for the master word line, wherein the voltage on the first word line and the voltage on the second word line are increased based at least in part on the refresh command; and
maintaining the voltage on the master word line below the threshold level based at least in part on the refresh command.

6. The method of claim 1, further comprising:
receiving an activate command for a second master word line, wherein the voltage on the master word line is increased based at least in part on the activate command for the second master word line.

7. The method of claim 1, further comprising:
decreasing the voltage on the first word line before increasing the voltage on the second word line, wherein the voltage on the master word line is maintained below the threshold level during the decreasing of the voltage on the first word line.

8. The method of claim 7, further comprising:
decreasing the voltage on the second word line after increasing the voltage on the second word line, wherein the voltage on the master word line is maintained below the threshold level while decreasing of the voltage on the second word line.

9. The method of claim 1, further comprising:
coupling the first word line to a voltage supply based at least in part on decreasing the voltage on the master word line, wherein the voltage on the first word line is based at least in part on the voltage supply; and
coupling the second word line to the voltage supply based at least in part on decreasing the voltage on the master word line, wherein the voltage on the second word line is based at least in part on the voltage supply.

10. The method of claim 1, wherein the threshold level comprises a level below which a switching component between the first word line and a voltage supply is activated.

11. The method of claim 1, wherein increasing the voltage on the first word line couples a first memory cell with a first digit line, and wherein increasing the voltage on the second word line couples a second memory cell with a second digit line.

12. A method, comprising:
driving a voltage pulse on a first word line included in a set of word lines that is coupled with a master word line, wherein driving the voltage pulse on the first word line comprises increasing then decreasing a voltage on the first word line;
driving, after driving the voltage pulse on the first word line, a voltage pulse on a second word line included in the set of word lines, wherein driving the voltage pulse on the second word line comprises increasing then decreasing a voltage on the second word line; and
maintaining, in between driving the voltage pulse on the first word line and driving the voltage pulse on the second word line, a voltage on the master word line below a threshold level, wherein the threshold level comprises a level below which a switching component between the first word line and a voltage supply is activated.

13. The method of claim 12, wherein increasing the voltage on the first word line couples a first memory cell with a first digit line, and wherein increasing the voltage on the second word line couples a second memory cell with a second digit line.

14. The method of claim 12, further comprising:
determining whether the first word line and the second word line are in the set of word lines coupled with the master word line, wherein the voltage on the master word line is maintained below the threshold level based at least in part on the first word line and the second word line being in the set of word lines coupled with the master word line.

15. The method of claim 12, further comprising:
receiving a command for the master word line, wherein the voltage on the master word line is maintained below the threshold level based at least in part on the command being a refresh command.

16. The method of claim 12, further comprising:
receiving an activate command for a second master word line after driving the voltage pulse on the second word line; and
increasing the voltage on the master word line above the threshold level based at least in part on the activate command being for the second master word line.

17. The method of claim 16, further comprising:
decreasing, concurrent with increasing the voltage on the master word line, a voltage on the second master word line based at least in part on the activate command.

18. The method of claim 12, further comprising:
coupling the first word line with the voltage supply based at least in part on decreasing the voltage on the master word line below the threshold level, wherein the voltage on the first word line is increased based at least in part on coupling the first word line with the voltage supply; and
decoupling the first word line from a ground reference node based at least in part on decreasing the voltage on the master word line below the threshold level, wherein the voltage on the first word line is increased based at least in part on decoupling the first word line from the ground reference node.

19. The method of claim 12, further comprising:
receiving an activate command for the master word line; and
decreasing, based at least in part on the activate command, the voltage on the master word line below the threshold level before driving the voltage pulse on the first word line.

20. The method of claim 12, further comprising:
accessing a first memory cell coupled with the first word line based at least in part on increasing the voltage on the first word line; and
accessing a second memory cell coupled with the second word line based at least in part on increasing the voltage on the second word line.

21. A method, comprising:
receiving a command for a master word line coupled with a first word line and a second word line;
decreasing a voltage on the master word line below a threshold level based at least in part on the command, wherein a switching component coupled with the master word line and a voltage supply is activated based at least in part on decreasing the voltage on the master word line below the threshold level;
activating the first word line and the second word line after decreasing the voltage on the master word line; and
maintaining the voltage on the master word line below the threshold level in between activating the first word line and the second word line.

22. The method of claim 21, further comprising:
determining that the command is a refresh command, wherein the voltage on the master word line is maintained below the threshold level based at least in part on determining that the command is the refresh command.

23. The method of claim 21, wherein the command comprises an activate command for the first word line, the method further comprising:
receiving a second activate command for the second word line, wherein the voltage on the master word line is maintained below the threshold level based at least in part on the activate command and the second activate command being for the master word line.

24. The method of claim 21, further comprising:
receiving a precharge command for the master word line after receiving the command, the precharge command indicating that the voltage on the master word line is to be increased above the threshold level; and
delaying increasing the voltage on the master word line above the threshold level until an activate command for a second master word line is received.

25. The method of claim 21, further comprising:
activating a third word line coupled with the master word line, wherein the voltage on the master word line is maintained below the threshold level in between activating the second word line and the third word line.

26. The method of claim 21, further comprising:
deactivating the first word line and the second word line, wherein the first word line is activated and deactivated before the second word line is activated and deactivated.

27. An apparatus, comprising:
a master word line coupled with a set of word lines; and
a controller configured to cause the apparatus to:
decrease a voltage on the master word line below a threshold level;
increase, while the voltage on the master word line is maintained below the threshold level, a voltage on a first word line of the set of word lines and a voltage on a second word line of the set of word lines; and
increase the voltage on the master word line above the threshold level after increasing the voltage on the first word line.

28. The apparatus of claim 27, wherein the controller is further configured to cause the apparatus to:
maintain, based at least in part on the first word line and the second word line being in the set of word lines coupled with the master word line, the voltage on the master word line below the threshold level in between increasing the voltage on the first word line and increasing the voltage on the second word line.

29. An apparatus, comprising:
a master word line coupled with a set of word lines; and
a controller configured to cause the apparatus to:
drive a voltage pulse on a first word line included in the set of word lines that is coupled with the master word line, wherein driving the voltage pulse on the first word line comprises increasing then decreasing a voltage on the first word line;
drive, after driving the voltage pulse on the first word line, a voltage pulse on a second word line included in the set of word lines, wherein driving the voltage pulse on the second word line comprises increasing then decreasing a voltage on the second word line; and
maintain, in between driving the voltage pulse on the first word line and driving the voltage pulse on the second word line, a voltage on the master word line below a threshold level, wherein the threshold level comprises a level below which a switching component between the first word line and a voltage supply is activated.

30. The apparatus of claim 29, wherein the controller is further configured to:
determine that the first word line and the second word line are in the set of word lines coupled with the master word line, wherein the voltage on the master word line is maintained below the threshold level based at least in part on the first word line and the second word line being in the set of word lines coupled with the master word line.

* * * * *